United States Patent [19]

Hillard

[11] Patent Number: 5,023,561
[45] Date of Patent: Jun. 11, 1991

[54] APPARATUS AND METHOD FOR NON-INVASIVE MEASUREMENT OF ELECTRICAL PROPERTIES OF A DIELECTRIC LAYER IN A SEMICONDUCTOR WAFER

[75] Inventor: Robert J. Hillard, Avalon, Pa.

[73] Assignee: Solid State Measurements, Inc., Pittsburgh, Pa.

[21] Appl. No.: 518,712

[22] Filed: May 4, 1990

[51] Int. Cl.[5] .............................................. G01R 27/14
[52] U.S. Cl. ................................ 324/719; 324/158 D
[58] Field of Search ................... 324/719, 158 R, 663, 324/158 P, 158 D, 72.5, 71.1, 662, 671; 427/8

[56] References Cited

U.S. PATENT DOCUMENTS 3,628,137 12/1971 Mazur ................................. 324/719
3,995,216 11/1976 Yin ................................. 324/158 R
4,325,025 4/1982 Corcoran et al. ................ 324/158 R Primary Examiner—Kenneth A. Wieder
Assistant Examiner—Maura K. Regan
Attorney, Agent, or Firm—Ronald S. Lombard

[57] ABSTRACT

An apparatus and method for measurement of electrical properties of a dielectric layer on a semiconductor wafer body is disclosed. The apparatus supports the semiconductor wafer body in position and two electrical contacts are utilized, one of which is a probe tip having a uniformly flat contact portion. Means are provided for establishing a planar contact between the flat contact portion of the probe tip and the dielectric layer of the semiconductor wafer. Measurements of the electrical properties of the dielectric layer can then be made without the use of patterned mesas.

9 Claims, 12 Drawing Sheets

APPARATUS AND METHOD FOR NON-INVASIVE MEASUREMENT OF ELECTRICAL PROPERTIES OF A DIELECTRIC LAYER IN A SEMICONDUCTOR WAFER

BACKGROUND OF THE INVENTION

This invention relates generally to an apparatus for measurement of electrical properties in a semiconductor wafer, and, in particular, the measurement of the electrical properties of a dielectric layer in a semiconductor wafer body without invading the semiconductor wafer material. The determination of the electrical properties of a dielectric layer in a semiconductor wafer body is a critical factor in the production of such wafers as is well known in the art. Measurements such as dielectric rupture voltage, dielectric field strength, time dependent dielectric breakdown and oxide charge measurements, for example, are typically accomplished by first fabricating metal or doped polysilicon mesas over the dielectric layer that serve as electrical contacts to which measurement probes may be applied. The metal mesas or dots, together with the dielectric layer and substrate form an metal-oxide-semiconductor structure. Fabrication of the metal mesas is a time-consuming and costly operation. It typically involves the application of an aluminum metal layer above the dielectric or oxide layer. An organic layer is then applied in a masking operation followed by an acid etching to leave the metal mesas in the desired areas. A sintering and alloying process is then completed to make a chemical bond between the metal mesas and the dielectric or oxide layer.

Also, as is well known in the art, mesa fabrication method may create inaccurate measurements because of the invasiveness of the technique with the wafer structure.

An alternative to mesas is described in an article entitled "Vacuum Operated Mercury Probe for CV Plotting and Profiling" by Albert Lederman, Solid State Technology, August 1981, pps. 123-126. This article discloses utilizing mercury contacts for replacing aluminum in capacitive voltage measurement techniques designed to characterize semiconductor properties. The Lederman paper discloses a vacuum operated mercury probe for doing measurements of MOS, homogeneous, non-homogeneous semiconductor wafers and semiconductor wafers on insulating substrates. Problems may arise utilizing the Lederman mercury probe in that mercury may react chemically with the materials of the wafer under study. Mercury also poses a significant safety problem in its use, and mercury sublimes at elevated temperatures when accelerated temperature testing of the semiconductor wafer is desired. Thus, a mercury probe has limited application.

SUMMARY OF THE INVENTION

The present invention overcomes the foregoing described difficulties of the prior art methods of measuring the electrical properties of dielectric layers in a semiconductor wafer body.

The present invention provides an apparatus and method for measurement of the electrical properties of the dielectric layer in a semiconductor wafer body. The semiconductor wafer body typically includes a substrate. The apparatus comprises means for supporting the semiconductor wafer body in the predetermined position. A first electrical contact is provided for contacting the substrate of the semiconductor wafer body. A second electrical contact is provided for contacting the dielectric layer. The second electrical contact comprises a probe which includes a metal probe tip. The metal probe tip has a uniformly flat contact portion thereon of predetermined dimensions.

The apparatus of the present invention also comprises kinematically stable probe arm positioning means including a probe arm having the probe affixed to it. The kinematically stable probe arm positioning means is for controlling the pressure and rate of travel of the probe tip. Means are provided for establishing a planar contact between the uniformly flat contact portion of the probe tip and the outer surface of the dielectric layer of the semiconductor wafer body. Measurement means are provided for causing an electrical current to flow through the dielectric layer and measuring the resultant electrical properties of the dielectric layer. The measurement means is connected in circuit with the first electrical contact and the second electrical contact.

Desirably, the means for establishing a planar contact between the flat contact portion of the probe tip and the outer surface of the dielectric layer of the semiconductor wafer body includes an optical means for focusing on a reference plane to insure planar contact between the uniformly flat contact portion of the probe tip and the dielectric layer of the semiconductor wafer body. Desirably the kinematically stable probe arm positioning means includes a fulcrum for supporting the probe arm and probe arm movement means for controlling the movement of the probe arm.

Another embodiment of the invention provides a semiconductor wafer body movement means to move the wafer body relative to the probe tip which provides a mapping capability to the apparatus.

The present invention also provides a method for measuring the electrical properties of a dielectric layer in a semiconductor wafer body. The semiconductor wafer body includes a substrate. The method includes first supporting the semiconductor wafer body in predetermined position. Next, the substrate is contacted with a first electrical contact. A uniform planar contact is then established by kinematically controlling a second electrical contact to contact the outer surface of the dielectric layer of the semiconductor wafer body. The electrical properties of the dielectric layer may then be measured by causing an electrical current to flow between the first and second electrical contacts.

BRIEF DESCRIPTION OF THE DRAWINGS

For a better understanding of the invention, reference may be had to the accompanying drawings exemplary of the invention, in which.

BRIEF DESCRIPTION OF THE PREFERRED EMBODIMENTS

Figure 2:
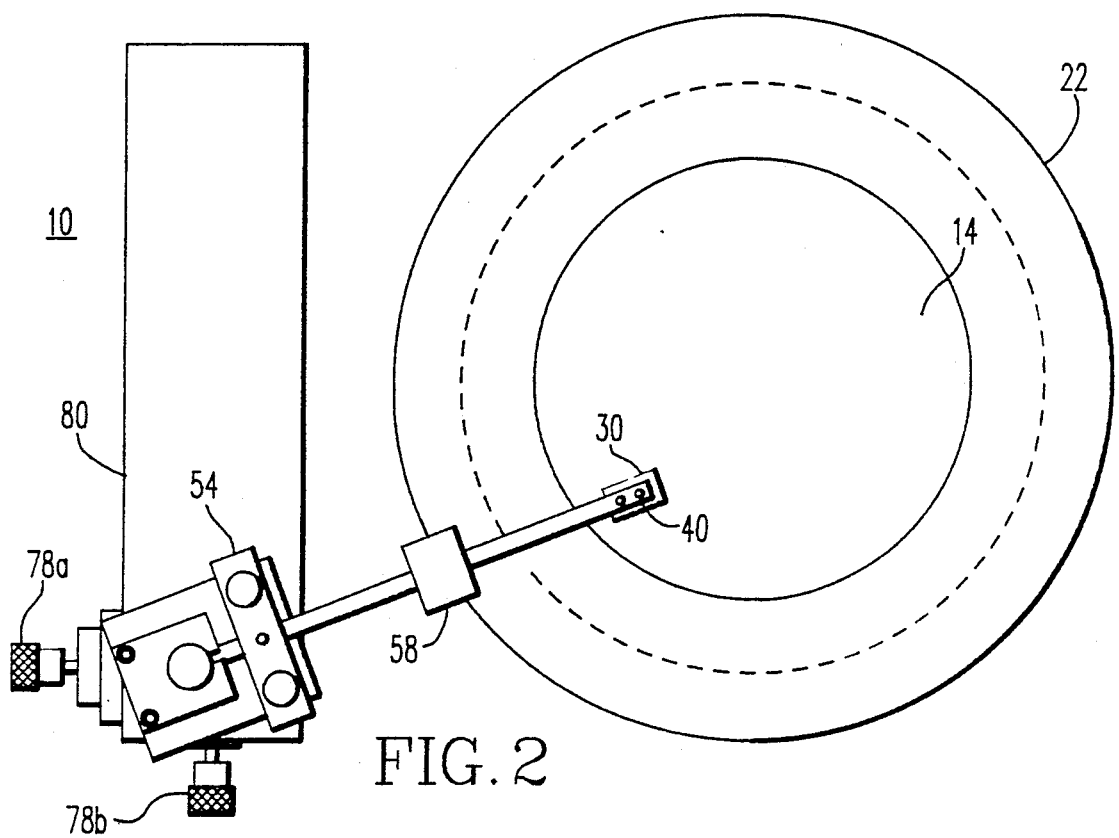
FIG. 2 is a plan view of the apparatus shown in FIG. 1.
Figure 1:
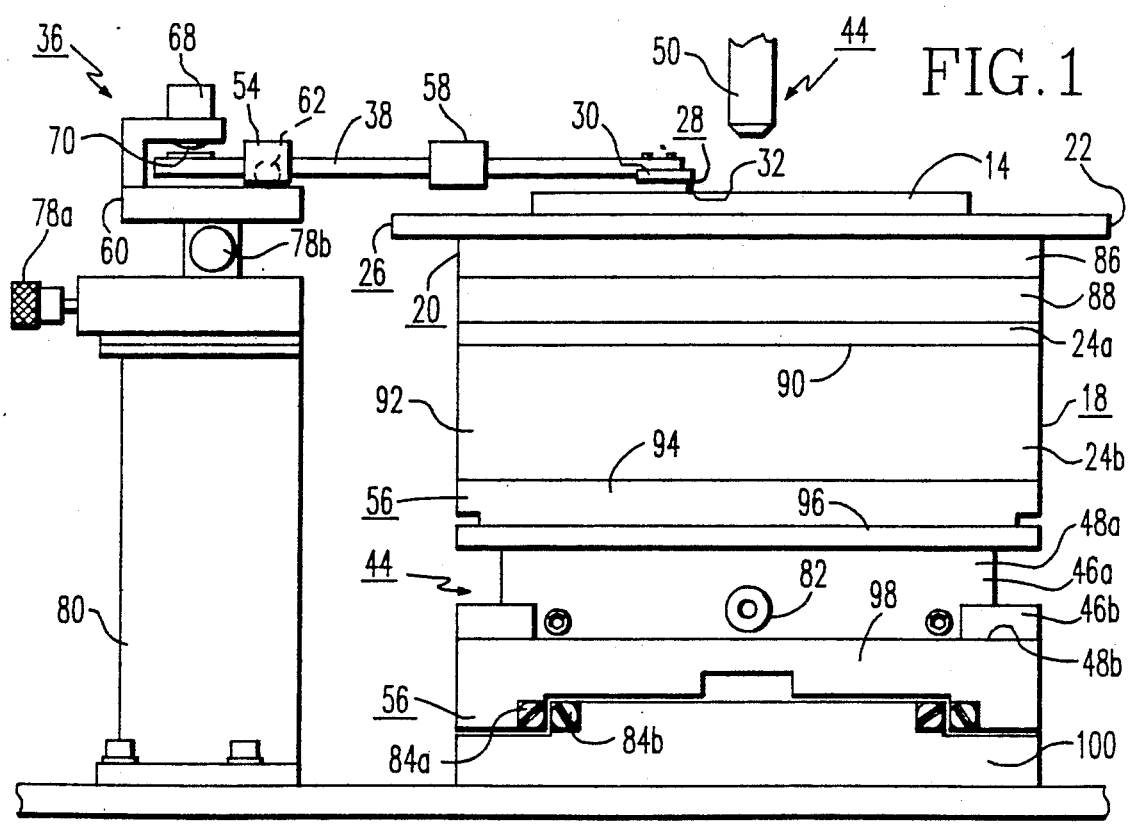
FIG. 1 is a elevational view, partially in section, of the apparatus of the present invention.
Figure 3:
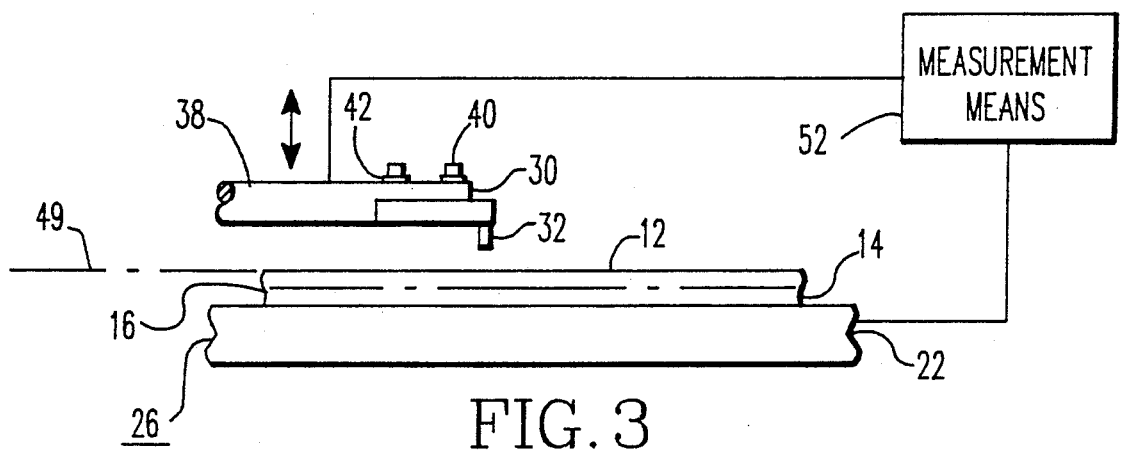
FIG. 3 is a schematic elevational sectional view of the prove in position above the semiconductor wafer to be tested in circuit with the measurement means.

Referring to FIGS. 1-3 there is shown an apparatus 10 for the measurement of the electrical properties of a dielectric layer 12 in a semiconductor wafer body 14. The semiconductor wafer body includes a substrate 16.

The apparatus 10 includes means for supporting the semiconductor wafer body 18 which may be a movable stage assembly 20, such as, shown in FIG. 1 which is a part of a semiconductor wafer body measurement apparatus sold by Solid State Measurements, Inc., Pittsburgh, Pa., the present assignee, Model No. SSM-240. The movable stage assembly 20 includes a vacuum chuck 22 which holds the semiconductor wafer 14 by means of vacuum. The vacuum chuck 22 is attached to the movable stage assembly 20 by means of an allen screw not shown. The model SSM-240 movable stage assembly 20 includes rotational movement members 24A, 24B which members are power driven and allows one to rotate the wafer body to be studied.

Figure 4:
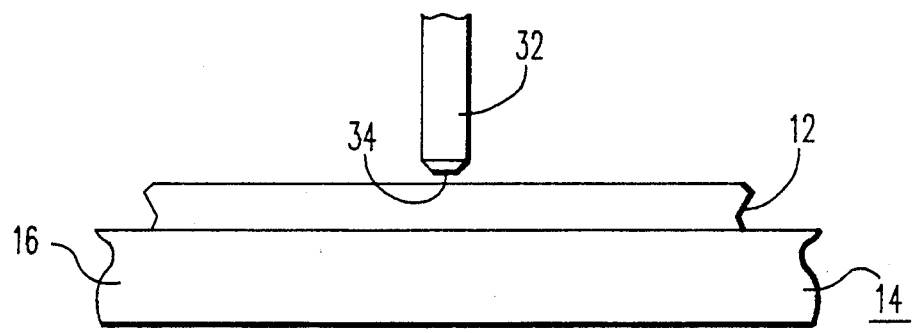
FIG. 4 is an enlarged elevational view of the probe tip in position above the semiconductor wafer to be tested.

A first electrical contact 26 is provided for contacting the substrate 16 of the semiconductor wafer body 14, as shown in FIG. 3. A second electrical contact 28 is provided for contacting the outer surface 11 of the dielectric layer 12 of the semiconductor wafer body 14. The second electrical contact comprises probe 30. The probe 30 includes conductive probe tip 32 as shown in FIGS. 3 and 4. The conductive probe tip 32 has a uniformly flat contact portion 34 thereon of predetermined dimensions. In one embodiment of the invention the conductive probe tip 32 is a refractory metal such as tungsten-osmium alloy. A critical aspect of the present invention is insuring that the contact portion 34 is uniformly flat along the reference plane 49 established for contact with the semiconductor wafer body 14 to be measured. Using a tungsten-osmium alloy probe tip for example, the contact layer portion 34 is preferably, in the final stages of preparation, grinded by using a 1.0, 0.25 and 0.1 $\mu$m diamond paste in the reference plane established to insure a uniform flat surface. Preferably, the flat dielectric layer contact portion is circular. The probe tip is aligned vertically with the reference plane when the probe tip 32 contacts the wafer 14. A circular dielectric layer contact portion 34 is desirable for accurate area determination. This is critical for determining yield analysis for defect density which is the number of defects across the surface of the semiconductor wafer body over the total area contacted. For example, the area of an ellipse is much more difficult to determine. Of course any shape of the contact portion may suffice as long as the area can be accurately determined. The flat oxide layer contact portion may have a diameter of from about 5 to 2000 microns. Preferably, the diameter after grinding is 300 to 500 microns.

A kinematically stable probe arm positioning means 36 is provided as shown in FIG. 1. The kinematically stable probe arm positioning means 36 shown in FIG. 1 is also a part of the commercially available model SSM-240 manufactured by Solid State Measurements, Inc. Another example of a kinematically stable probe arm is disclosed in U.S. Pat. No. 3,628,137 dated Dec. 14, 1971 issued to Robert G. Mazur. The said U.S. Pat. No. 3,628,137 issued to Robert G. Mazur is made a part hereof and is incorporated herein as though fully set forth. The Mazur kinematically stable probe arms are described in column 5, lines 22-69. The kinematically stable probe arm positioning means 36 shown in FIG. 1 comprises a probe arm 38 which has probe 30 affixed thereto by studs 40 and nuts 42. The probe arm 38 may be made of nickel-stainless steel for example. The kinematically stable probe arm positioning means 36 is for controlling the pressure and rate of travel or descent of the probe tip 32. This is critical to prevent the probe tip 32 from scrubbing the wafer body 14 and causing damage. Also the proper pressure must be applied by the probe tip, such as, 10 pounds per square inch. The rate of descent is preferably 0.016 inches per second, for example.

The kinematically stable probe arm positioning means 36 in one embodiment further comprises a fulcrum 54 for supporting the probe arm 38. Preferably, the apparatus 10 further comprises a semiconductor wafer body movement means 56 for moving the wafer body horizontally relative to the probe tip 32.

Figure 7:
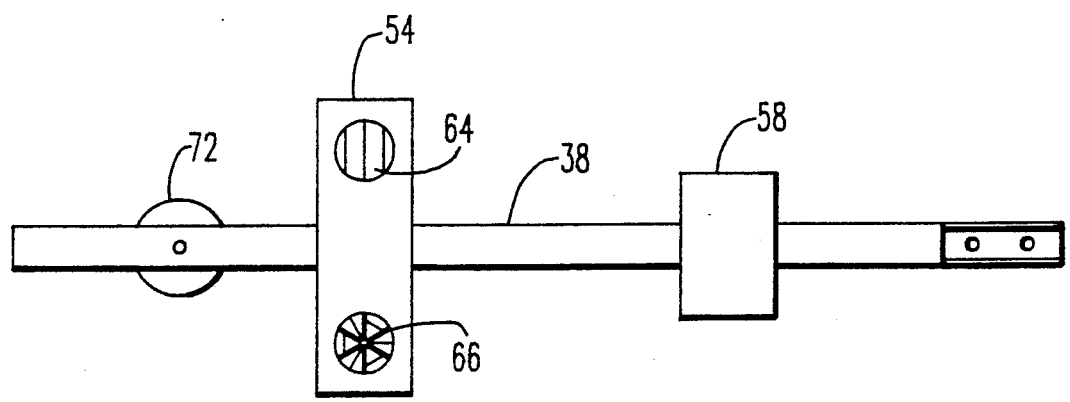
FIG. 7 is a bottom view of the kinematically stable probe arm shown in FIG. 5.

With particular reference to FIGS. 1 and 2, the conductive probe tip 32 is affixed to the probe 30 by welding. As shown in FIG. 3, studs 40 and nuts 42 hold the probe to the probe arm 38. The probe arm weight 58 is used to fix the probe tip load. The probe tip loads as used are generally between 5 and 45 grams. Lower bearing plate 60 supports the fulcrum 54 by means of bearing balls 62 which contact the fulcrum 54 by seating into the V-groove 64 and the conical groove 66 shown in FIG. 7.

Figure 8:
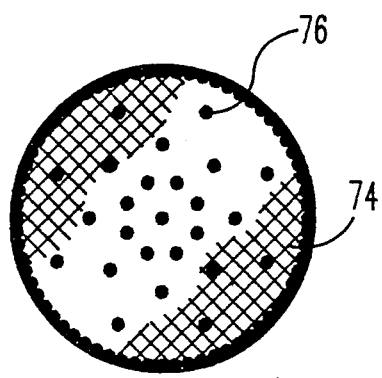
FIG. 8 is an enlarged view of the lifter pad wire mesh of the kinematically stable probe arm shown in FIG. 5.
Figure 5:
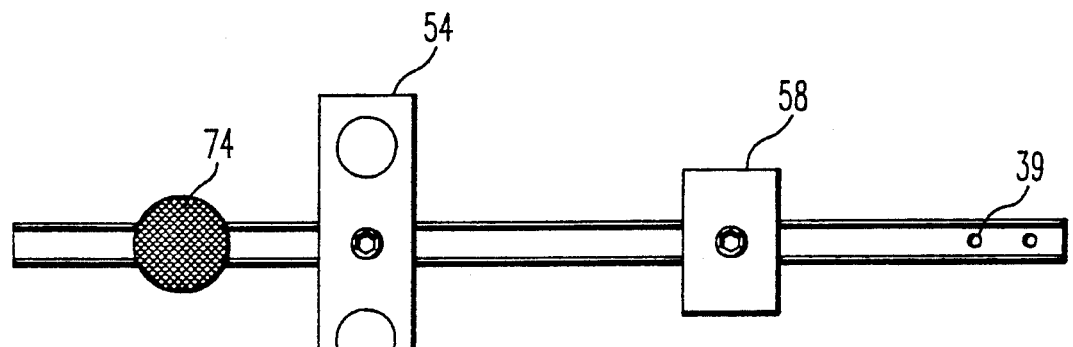
FIG. 5 is a plan view of the kinematically stable probe arm.
Figure 6:
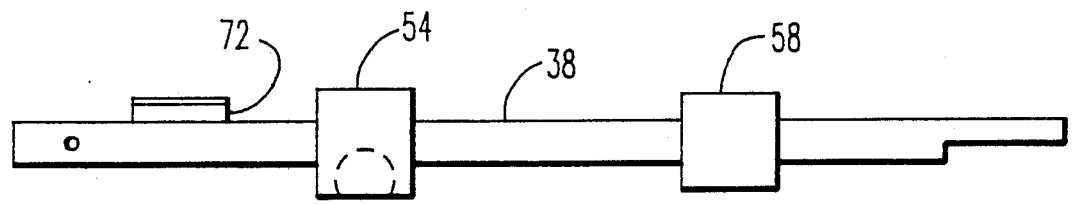
FIG. 6 is an elevational view of the kinematically stable prove arm shown in FIG. 5.

The probe arm 38 is raised and lowered pneumatically by means of a probe lift chamber 68 which includes a rubber diaphragm 70 to contact the arm lifter pad 72. The arm lifter pad 72 is covered with a wire mesh 74 shown in FIGS. 5 and 8. The wire mesh 74 is held in position by means of spot welds 76. To raise the arm 38, air pressure inflates the diaphragm 70 to contact mesh 74. Probe alignment relative to the viewing position of the microscope 50 is accomplished by means of micropositioners 78a, 78b. High quality contact formation between the probe tip and the wafer is made by controlling the load characteristics of the probe arm, see ASTM-F525 and Solid State Measurement, Inc. Technical Report, "Spreading Resistance Profile in GaAs", page 7.

Probe stand 80 is made to achieve the proper probe tip height relative to the semiconductor wafer 14.

As stated previously, the semiconductor wafer body 14 is placed on vacuum chuck 22 and is held in place by means of a vacuum. The vacuum chuck 22 also functions as the first electrical contact 26 and is connected in circuit with the measurement means 52, as shown in FIG. 3. The semiconductor wafer 14 is brought into alignment with an established reference plane 49, shown in FIG. 3. By using manual adjustment member 82 to move wedges 48a, 48b thereby moving the semiconductor wafer 14 vertically while optically setting the adjustment to the reference plane 49 by use of the microscope 50. The SSM-240 is provided with a horizontal and rotational movement means 56 to control horizontal and rotational movement of the wafer. Referring to FIG. 1, movable stage assembly 20 includes stainless steel mounting plate 86. An insulator section 88 is included to electrically insulate the first electrical contact 26 from the remainder of the assembly 20. Rotary stage plate 90 rotates the wafer and is driven by rotary drive section 92. An X-axis stage including top 94 and bottom 96 provides horizontal left to right movement. Y-axis stage including top 98 and bottom 100 provides horizontal movement by using roller bearings 84a, 84b to allow for in and out motion. Of course, a movement system such as that shown in the foregoing U.S. Pat. No. 3,628,137 issued to Mazur may be used. The horizontal and rotational movement means 56 provides wafer mapping capability.

Means 44 for establishing planar contact between the flat dielectric layer contact portion 34 of the probe tip 32 and the dielectric layer 12 of the semiconductor wafer body 14 is provided. Preferably the means for establishing a planar contact 44 include wafer body elevation members 46a, 46b, which in the Model SSM-240 includes two opposing wedges 48a, 48b which are manually adjusted to impact vertical motion to the wafer 14 being studied. Preferably, the means for establishing the planar contact 44 also include an optical means 50 for focusing on a reference plane to insure planar contact between the flat contact portion 34 of the probe tip 32 and outer surface 11 of the dielectric layer 12 of the semiconductor wafer body 114. The optical means 50 is typically a microscope. The reference plane 49 for the planar contact between the flat dielectric layer contact portion 34 and the dielectric 12 is set at the focal length of the microscope so that setting the focus of the microscope establishes the reference plane.

The measurement means 52 for causing an electrical current to flow through the dielectric layer 12 and measuring the resultant electrical properties of the dielectric layer is provided. The measurement means 52 is connected in circuit with the first electrical contact 26 and the second electrical contact 28 as shown in FIG. 3. The measurement means 52 is well known in the art as hereinafter described.

The method of the present invention for measuring the electrical properties of a dielectric layer 12 in a semiconductor body 14 entails first supporting the semiconductor wafer body 14 in predetermined position which is accomplished for example by resting the wafer on the vacuum chuck 22 shown in FIG. 1. A substrate 16 is then contacted by the first electrical contact 26 which in the embodiment shown is vacuum chuck 22. The second electrical contact 28 which is the probe tip 32 is kinematically controlled by the probe arm positioning means 36 to establish a planar contact with the dielectric layer 12. Measurements of the electrical properties of the dielectric layer 12 may be accomplished by causing an electrical current to flow between the first electrical contact 26 and the second electrical contact 28. Time dependent measurements can be made and consist of utilizing either a constant current or constant voltage. Measurement procedures and analysis are straight forward and known in the art. The following dielectric integrity references may be used "An Operational Definition for Breakdown of Thin Thermal Oxides of Silicon", by P. A. Heinmann, IEEE Electron Devices, Vol. Ed. 30, No. 10, Oct., 1983, other references "Electric Breakdown in Thin Gate and Tunneling Oxides", by I. Chen, et al., IEEE Electron Devices, Vol. Ed.-32, No. 2, Feb., 1985. The characterization of gate oxide reliability is discussed in "Modeling and Characterization of Gate Oxide Reliability", by J. C. Lee, et al., IEEE Electron Devices, Vol. 35, No. 12, Dec., 1988, p. 2268. A breakdown of $SiO_2$ films is discussed in "Time Dependent Dielectric Breakdown of Thin Thermally Ground $SiO_2$ Films" by K. Yamase et al., IEEE Electron Devices, Vol. Ed. 32, No. 2, Feb., 1985, p. 423.

As previously discussed, electrical properties of dielectric layers such as silicon dioxide thin films are usually studied by using the film as the dielectric in a metallic oxide semiconductor device. This approach is time consuming in that it requires additional processing to create MOS structures as previously discussed. Utilizing the apparatus and method of the present invention it is possible to characterize thin dielectric films; for example, $SiO_2$ on silicon, without creating MOS structures using the carefully prepared probe tip 32 of the present invention placed directly on top of the outer surface 11 of the dielectric layer 12.

The method and apparatus of the present invention were tested comparing the results obtained from a 320 nm thick thermal $SiO_2$ film to results obtained with patterned $N^+$ polysilicon mesa structures fabricated on the same $SiO_2$ film. An electrical contact to the back of the SIMOX wafers were made through vacuum chuck 22, probe tip 32 is mounted on the kinematically stable probe arm 38 loaded at 10 grams. The flat dielectric layer contact portion 34 of the probe tip 32 was prepared as discussed previously to yield a contact diameter of 392 microns.

The static I-V curves were measured on each wafer tested in a 10×11 matrix pattern by applying a series of 20 constant current values in the range of $10^{-10}$ to $10^{-6}$ amps and measuring the corresponding voltages. A two second delay at each measurement was found sufficient to obtain stabilization of the measured voltage. The breakdown voltage and self-healing behavior were determined from the I-V characteristics. A constant voltage stress was applied to determine the time dependence of the breakdown at a constant electric field. The acceleration factor associated with the breakdown of the dielectric is determined from a plot of log, time to breakdown, versus electric field. The oxide thickness was measured with a spectroscopic interferometer.

Samples were prepared using both n and p-type 20 ohm-cm CZ silicon wafers as a starting material for SIMOX substrates, the results shown here are only for the p-type substrates. The process is used for fabricating single and multiple implant SIMOX substrates summarized in Table 1.

TABLE 1

| Thermal Oxide |
| --- |
| 3200 Å thermal oxide |
| 1950 Å polysilicon deposition |
| phosphorus implant, $1 \times 10^{12}$ cm$^{-2}$, 30 keV |
| 950° C. N$_2$ anneal |
| backside Al metalization |
| patterning and plasma etching of N$_+$ polysilicon |
| Single O$^+$ Implant SIMOX |
| $1.9 \times 10^{18}$ cm$^{-2}$ oxygen implant at 200 keV |
| 6 hr. anneal, 1300° C., 1% O$_2$ in N$_2$ |
| BN solid source diffusion at 925° C. for 45 minutes |
| patterning and plasma etching of P$^+$ top silicon layer |
| Multiple O$^+$ Implant SIMOX |
| 0.5, 0.5, 0.8 $\times 10^{18}$ cm$^{-2}$ oxygen implants at 200 keV |
| each implant was annealed for 6 hrs. at 1300° C. in 1% O$_2$ in N$_2$ |
| BN solid source diffusion at 925° C. for 45 minutes |
| patterning and plasma etching of P$^+$ top silicon layer |

Unlike thin gate oxides, the SIMOX oxides are more than 300 nm thick; therefore, the properties measured are not significantly affected by the annealing atmosphere. Superficial silicon films were removed from the SIMOX wafers using a selective SF$_6$-based reactive ion etch to uncover the buried oxide. The exposed oxide layers were then evaluated with a modified point contact current voltage technique.

The 300 nm oxide was grown in steam at 1000° C. on n-type silicon, and compared to the SIMOX buried oxides. The thermal oxide properties were studied utilizing both a point contact current voltage technique with a conductive probe tip 32 of the present invention and conventional current voltage measurements utilizing pattern N+ polysilicon mesas.

Figure 9:
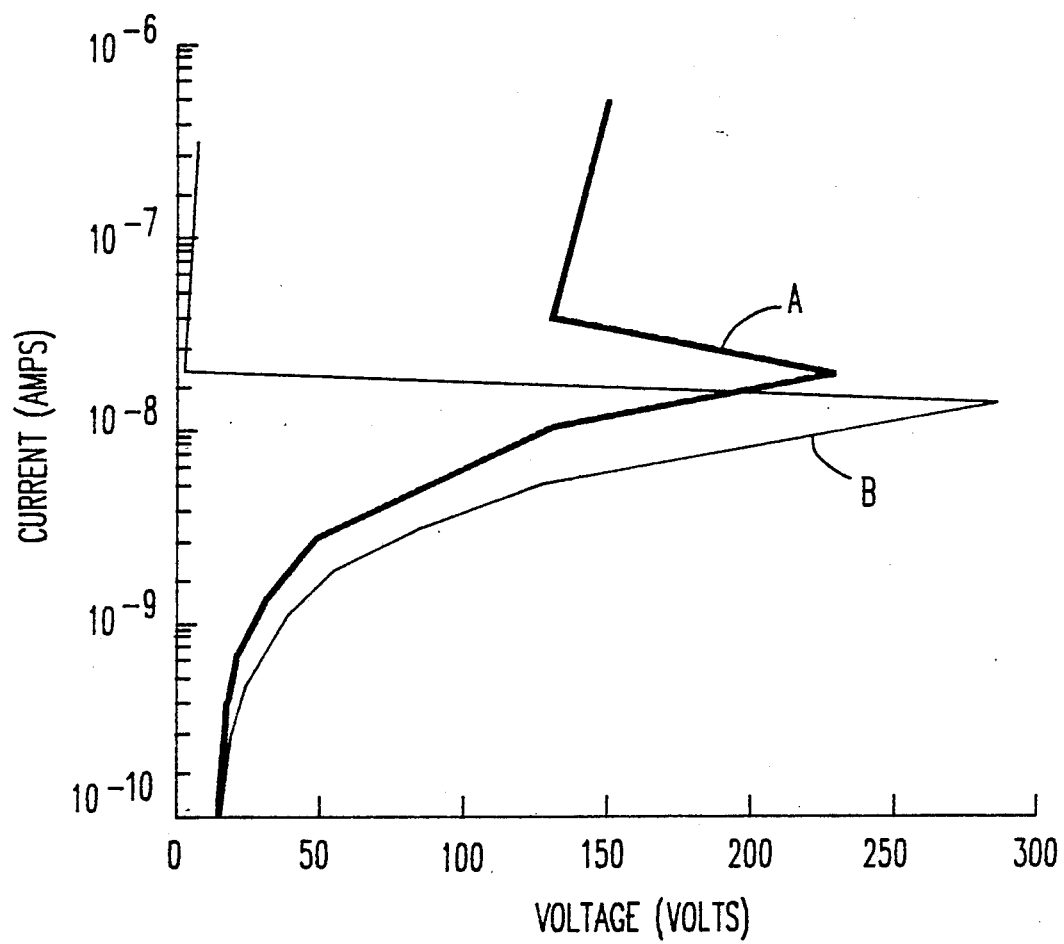
FIG. 9 are plots of current versus voltage obtained on a N+ polysilicon/thermal oxide structure using patterned silicon mesas shown by the heavy black line and by the apparatus of the present invention shown by the light line.

With the thermal oxide, typical I-V curves were obtained on the thermal oxide sample described in Table 1 with a patterned N+ polysilicon top mesa and probe tip 32 of the present invention placed directly on the oxide. The results are shown in FIG. 9. As can be seen the conductive probe tip of the present invention 32 yields a harder catastrophic oxide breakdown and a relatively higher voltage than the polysilicon curve as denoted as "A" and the curve obtained by the present invention is denoted by "B" in FIG. 9.

The hard oxide breakdown is identified by the I-V curve shifting to a low voltage following breakdown. Self-healing behavior is observed only in the case of the patterned polysilicon contact. Self-healing behavior in oxides usually occurs when silicon is present either as a top contact or as a containment within the oxide. The self-healing process occurs following breakdown, and the silicon present explosively evaporates, filling the weak spots in the oxide as discussed in an article by K. Yamabe and K. Taniguchi, IEEE Electron Devices, Vol. Ed. 32, No. 2, 1985, p. 423. Self-healing can occur many times within the same test and this is usually observed as a series of voltage jumps in the I-V curve.

To quantify the self-healing behavior exhibited in the I-V curves, a new parameter "snapback voltage", $V_{SB}$, is defined as the voltage immediately following oxide breakdown. This parameter is easily obtained from the I-V measurements and allows for a rapid determination of self-healing behavior within the oxide. In the absence of self-healing, hard oxide breakdown will occur in $V_{SB}$ will be negligible. When self-healing behavior is present, $V_{SB}$ will be large.

Figure 10:
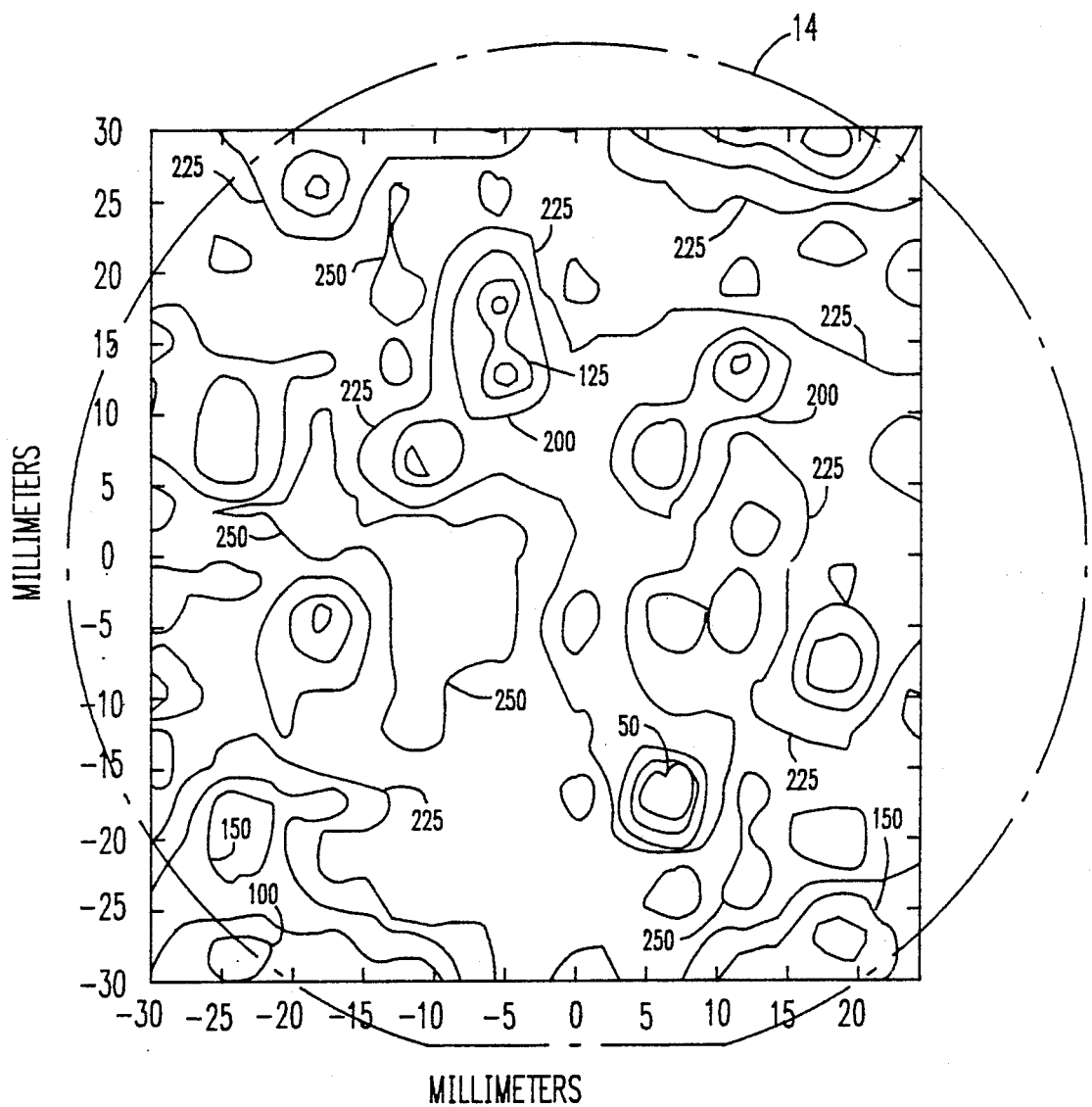
FIG. 10 is a contour map of oxide breakdown voltage for thermal oxide using a 75 millimeter wafer having an N+ polysilicon/thermal oxide structure using patterned silicon mesas.
Figure 11:
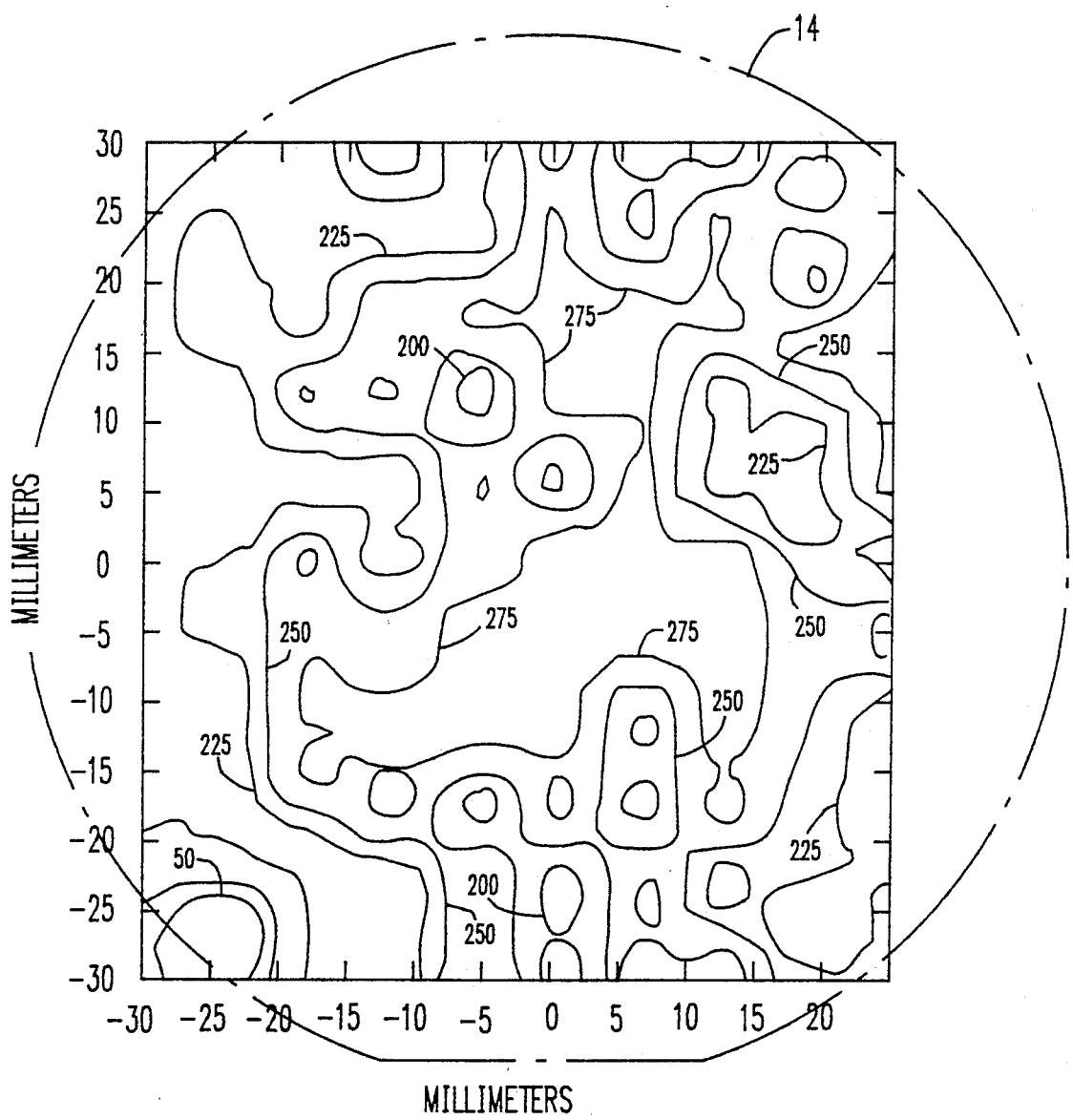
FIG. 11 is a contour map of the oxide breakdown voltage for thermal oxide structure using 75 millimeter wafers.
Figure 12A:
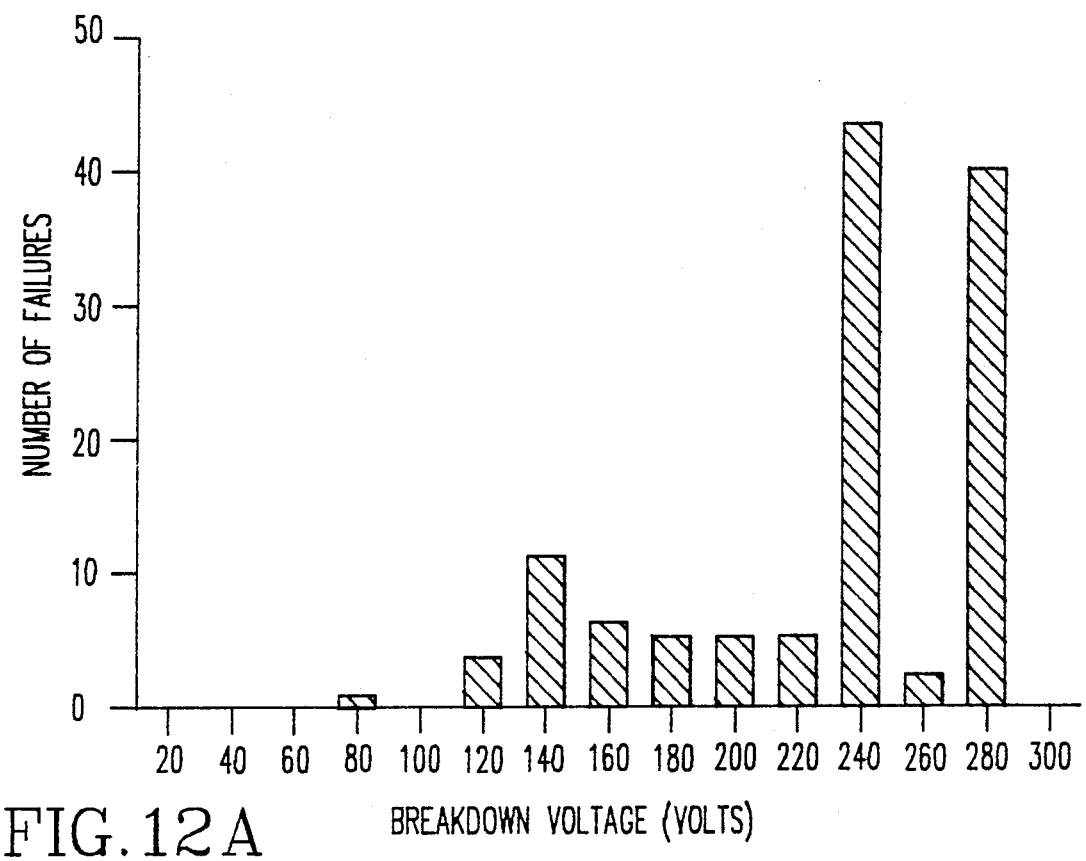
FIG. 12A is a histogram of oxide breakdown voltage for thermal oxide using N+ polysilicon contact mesas.
Figure 12B:
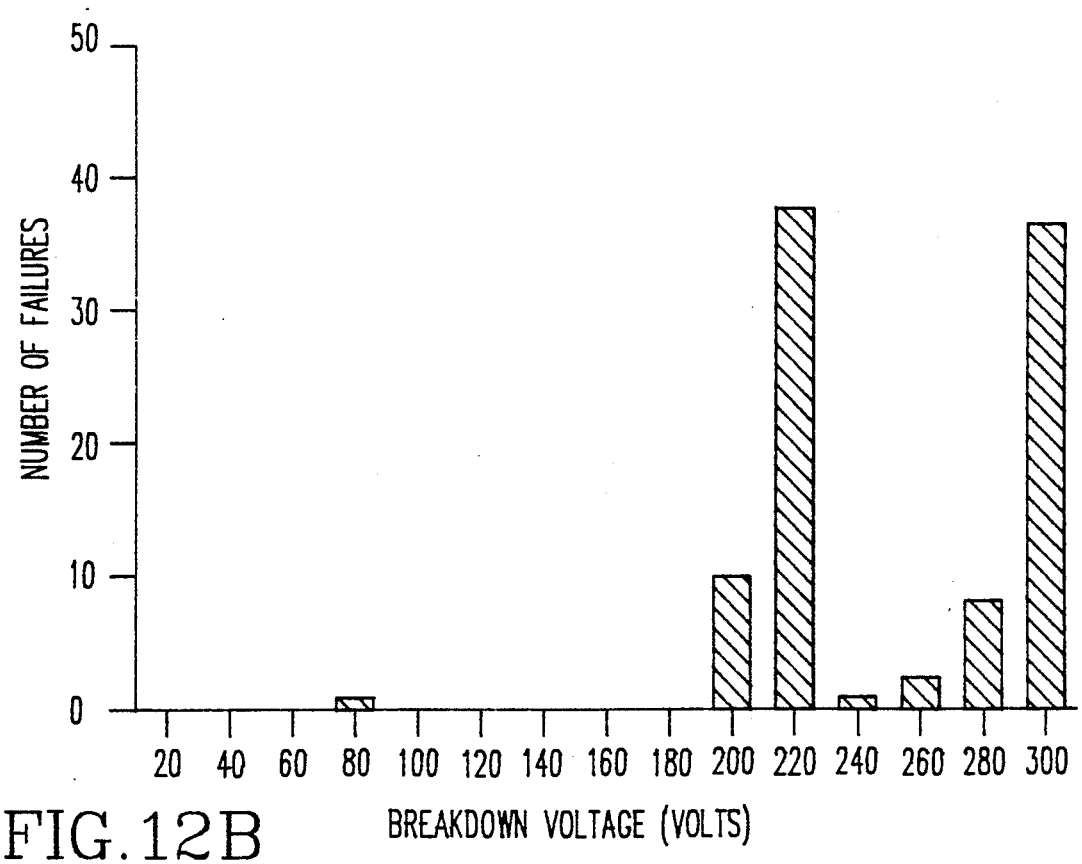
FIG. 12B is a histogram of oxide breakdown voltage for thermal oxide using the apparatus of the present invention.

Contour maps and histograms of the breakdown voltages, $VB_{OX}$ for thermal oxide are shown in FIGS. 10 and 11, respectively. $VB_{OX}$ values obtained from the pattern silicon mesas and with the method and apparatus of the present invention are in close agreement.

FIG. 10 illustrates that the regions of lowest breakdown are identified by both the conventional silicon mesas and the measurements obtained utilizing the conductive probe tip 32 of the present invention directly in contact with the oxide layer. FIG. 11 shows slightly lower breakdown voltages for silicon mesas which may be caused by stress induced grain boundary growth in the polysilicon, or by phosphorus incorporation into the oxide. Also, it can be seen in FIG. 11 the breakdown voltage distributions for both polysilicon contacts and measurements made by the present invention appear to be bimodal; this distribution may be related to the two regions of differing breakdown voltage shown in FIG. 10.

Figure 13A:
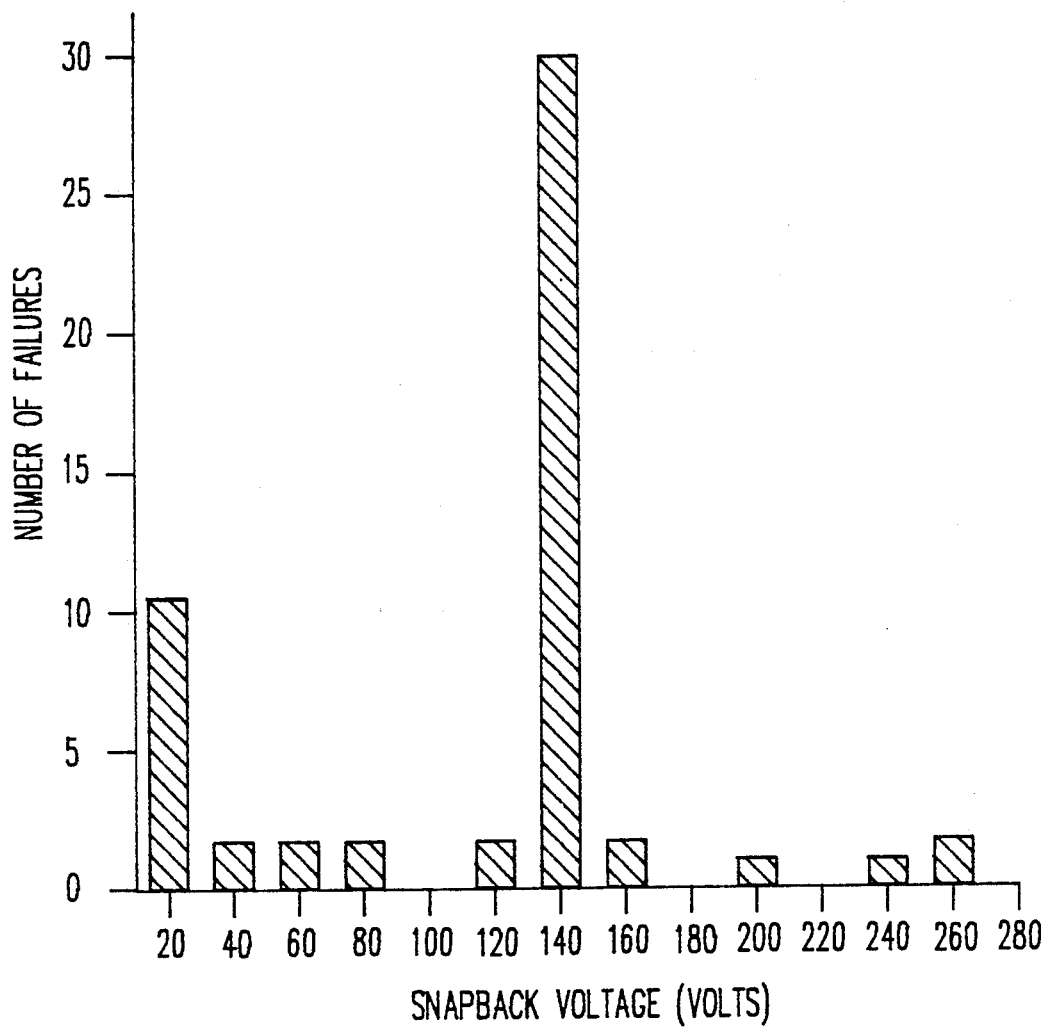
FIG. 13A is a histogram of the snapback voltages obtained for the thermal oxide using the polysilicon mesas.
Figure 13B:
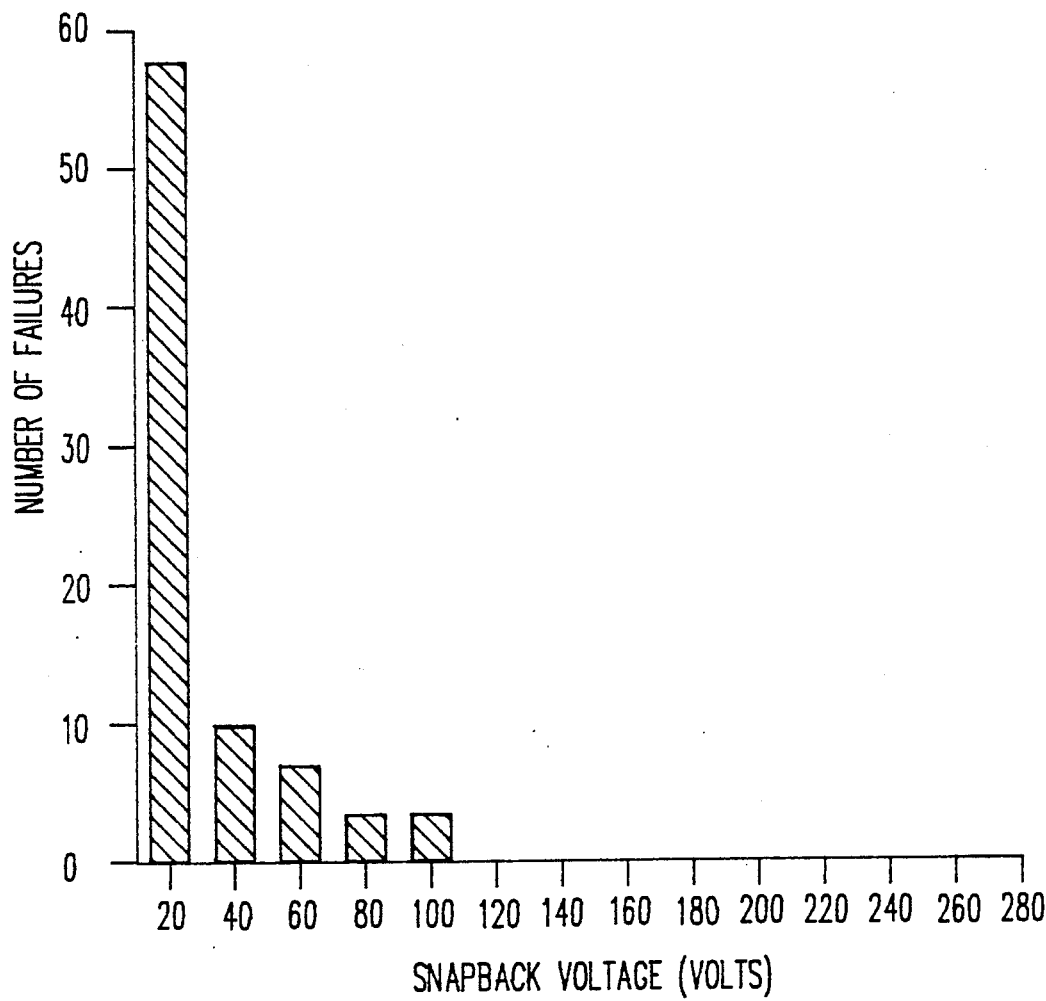
FIG. 13B is a histogram of the snapback voltages obtained for the thermal oxide using the apparatus of the present invention.

Histograms of the snapback voltages measured for the thermal oxide are shown in FIGS. 13A, 13B. Self-healing behavior is clearly present for polysilicon mesas as shown in FIG. 13A, and minimal for the measurements obtained by the present invention shown in FIG. 13B. The relative lack of self-healing behavior while practicing the method and apparatus of the present invention is most likely due to the fact that there is no polysilicon upper layer and that the thermal oxide is, of course, free of silicon inclusions.

Time dependent dielectric breakdown, TDDB, measurements were also made on the thermal oxide using both the conventional and measurements made by utilizing the present invention. Measured values of the charge to breakdown, $Q_{BD}$, obtained from both techniques were in close agreement. In addition, the field acceleration factor was obtained from a plot of log $T_{BD}$ versus 1/electric field. The slope of such a plot, commonly termed G, is a primary factor in determining oxide reliability. The reported values of G for thermal oxides are between 350 and 400 MV/cm. See I. Chen et al., IEEE Electron Devices Vol. Ed. 32, No. 2, February, 1985, page 413 and K. Yamabe and K. Tamiguchi, IEEE Electron Devices, Vol. Ed. 32, No. 2, 1985, p. 423. Measurements made on thermal oxide utilizing the present invention gave a value of 372 MV/cm which is consistent with the reported values.

Figure 14A:
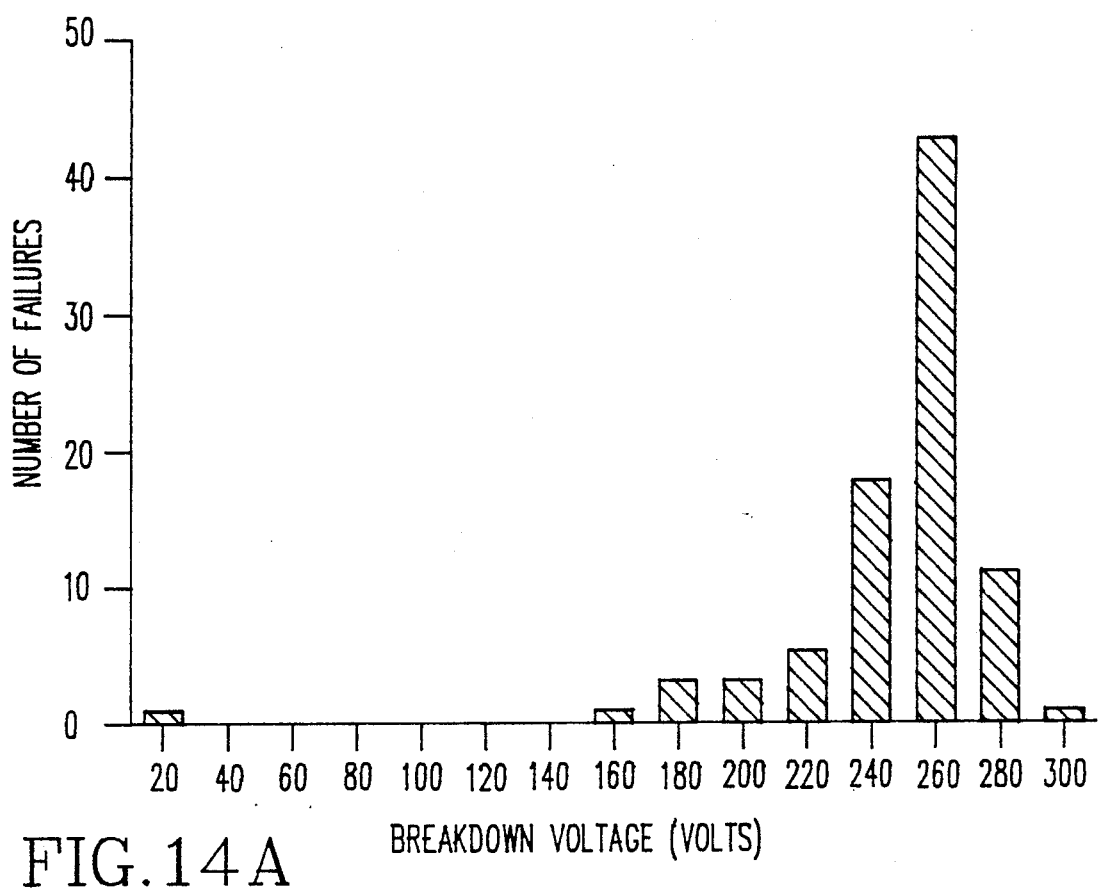
FIG. 14A is a histogram of oxide breakdown voltage for separation by implanted oxygen technique, i.e., SIMOX, formed by a single oxygen implant.
Figure 14B:
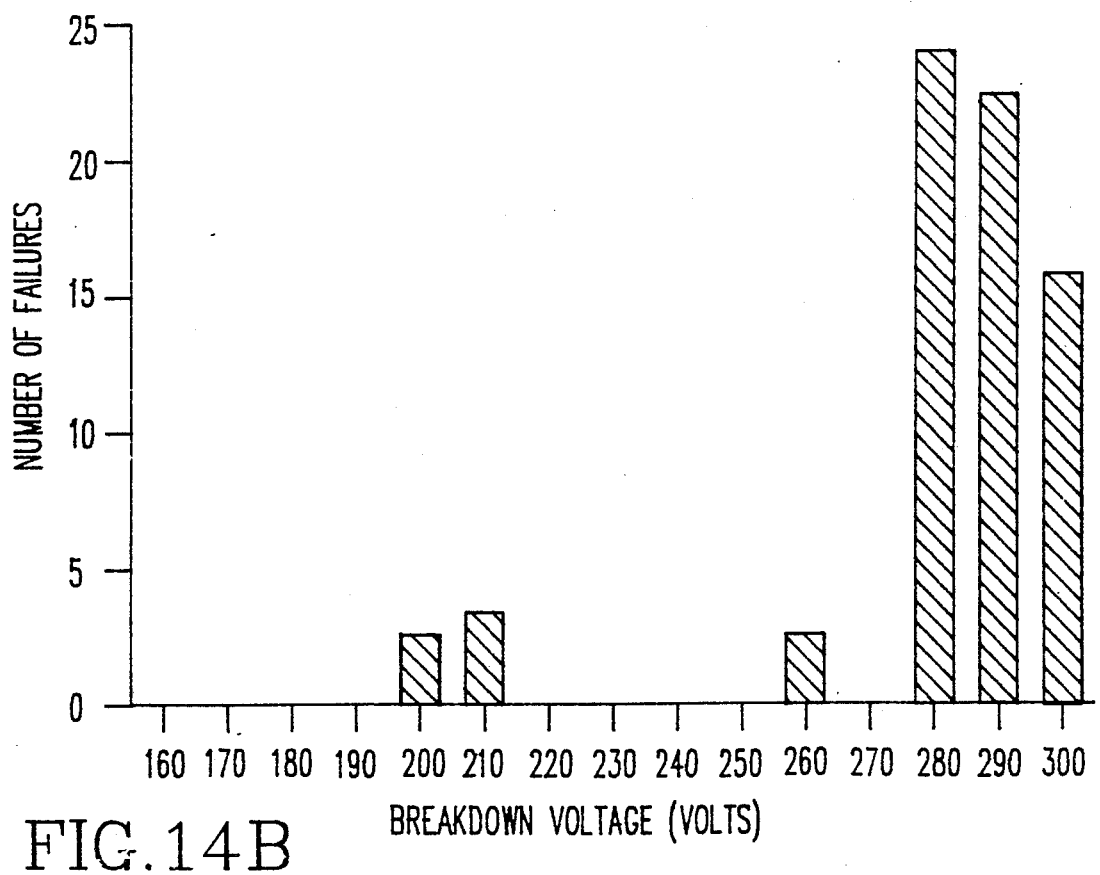
FIG. 14B is a histogram of oxide breakdown voltage for SIMOX buried oxides formed by a multiple oxygen implant using the apparatus of the present invention.
Figure 15A:
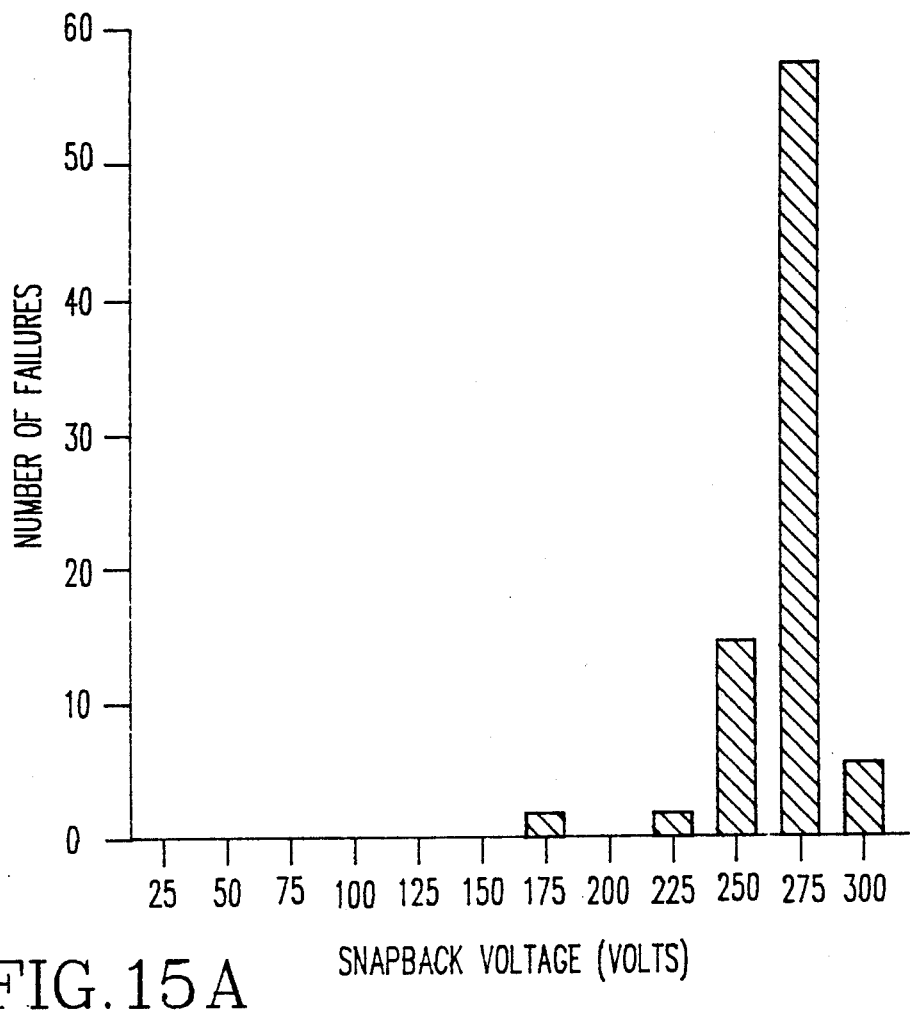
FIG. 15A is a histogram of snapback voltages obtained on SIMOX buried oxides formed by a single oxygen implant.
Figure 15B:
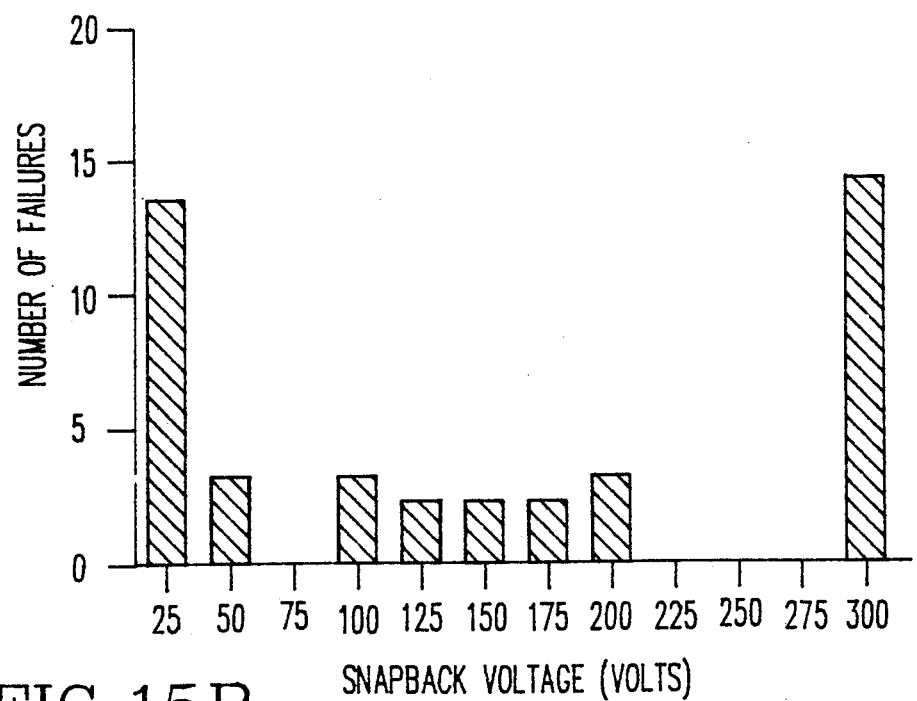
FIG. 15B is a histogram of snapback voltages obtained utilizing the apparatus of the present invention on SIMOX buried oxides formed by a multiple oxygen implant.

SIMOX buried oxides formed by single and multiple oxygen implants were studied utilizing the apparatus and method of the present invention. Histograms of oxide breakdown voltage for both types of SIMOX are shown in FIGS. 14A, 14B. As can be seen the breakdown voltage for the multiple implant buried oxide are higher than those obtained for the single implant SIMOX buried oxide. Histograms of the snapback voltages obtained for both types of SIMOX buried oxide are shown in FIG. 15A, 15B. Self-healing behavior is most evident for the SIMOX buried oxide formed by single oxygen implant. This may be due to the single implant oxide contains a larger number of silicon clusters. It can also be seen that the multiple implant oxide shows less self-healing than the single implant oxide, but not as little as self-healing as that seen in thermal oxide.

Figure 16:
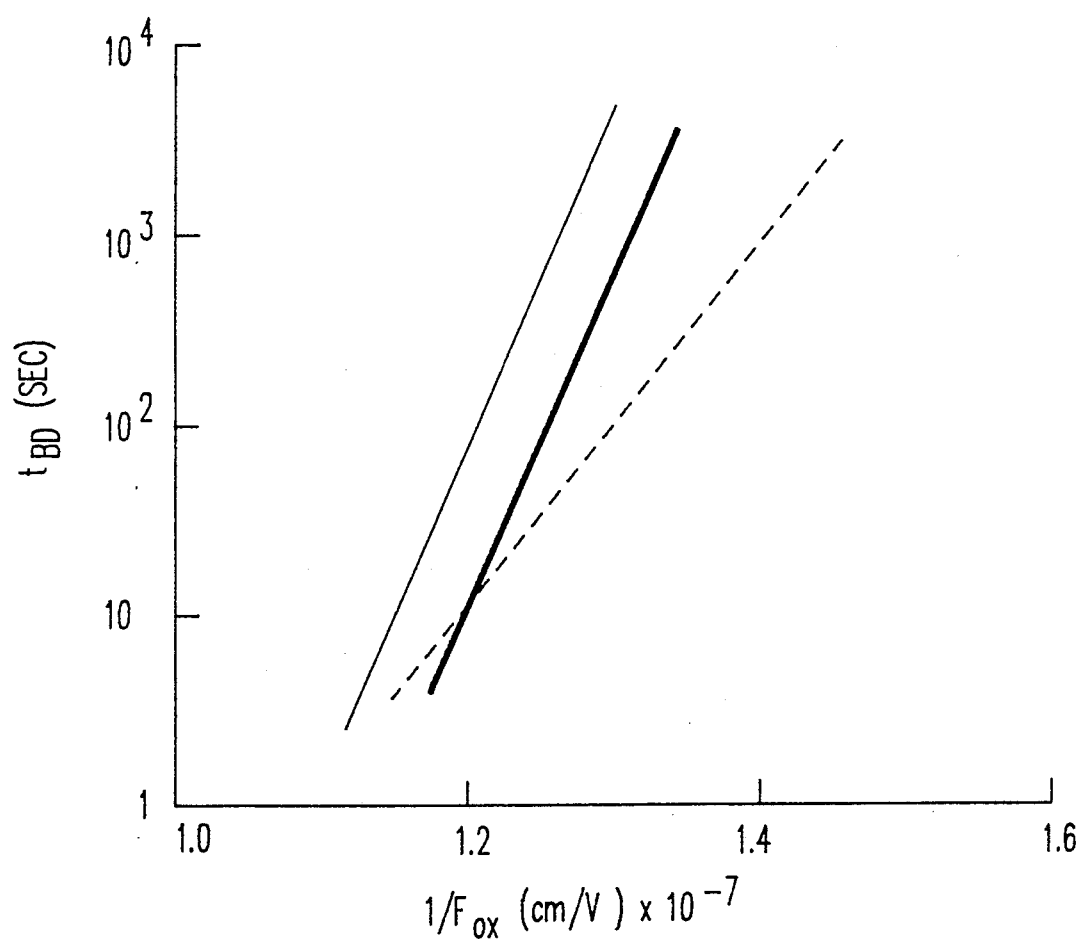
FIG. 16 is a plot of log ($t_{BD}$) versus $1/F_{OX}$ for measurements made by the present invention on the thermal oxide, the thin line; buried oxide formed by a single implant, the dark line; and buried oxide formed by a multiple implant process, the dashed line.

FIG. 16 shows oxide reliability measurements for both types of SIMOX buried oxide and for the thermal oxide; all measurements were taken using apparatus and method of the present invention together with a point contact current voltage technique. The lower oxide reliability for single implant SIMOX is indicated by the lower value of G, i.e., 211 MV/cm. The slope obtained from the multiple implant SIMOX is 381 MV/cm, in close agreement with the value obtained for the thermal oxide. Summary of the results obtained for both types of SIMOX buried oxides and the thermal oxide is given in Table 2.

TABLE 2

Summary of Results Comparing Oxide Breakdown Voltage, Snapback Voltage, Charge to Breakdown ($Q_{BD}$) and the Slope G.

| SOI STRUCTURE | OXIDE THICKNESS | OXIDE BREAKDOWN VOLTAGE | | SNAPBACK VOLTAGE | | $Q_{BD}$ | | SLOPE G log ($t_{BD}$) vs 1/Fox |
|---|---|---|---|---|---|---|---|---|
| | | Silicon Mesa | Present Invention | Silicon Mesa | Present Invention | Silicon Mesa | Present Invention | |
| THERMAL OXIDE | 3200 Å | 221 v (51 v)* | 242.5 v (47.2 v)* | 105.1 v (62.4 v)* | 19.9 v (25.7 v)* | 104 $\mu$C/cm$^2$ | 100 $\mu$C/cm$^2$ | 372 MV/cm |
| SINGLE IMPLANTED BURIED OXIDE | 3600 Å | N/A | 241.6 v (34.4 v)* | N/A | 285.5 v (14.8 v)* | N/A | N/A | 211 MV/cm |
| MULTIPLE IMPLANTED BURIED OXIDE | 3300 Å | N/A | 280.4 v (23.3)* | N/A | 130.6 v (104 v)* | N/A | N/A | 381 MV/cm |

*Standard Deviation

Utilizing the present invention capacitance-voltage measurements can be made for measuring metallic oxide semiconductor oxide charge. Bias-temperature stress testing is also easily performed to determine mobile ion density. Unlike the fabrication of aluminum mesas, no additional processing steps are required. Measurements can be made immediately following a critical process step such as gate oxidation.

Because measurements made by the present invention are made directly on the sample under evaluation, the results are not influenced by either metal or the additional processing. In addition much less force is utilized with the probe of the present invention than by conventional probing techniques thereby eliminating error introduced by the probes. This is a problem in many test facilities and manifests itself as additional shorts due to the probes.

Highly reproducible measurements may be made utilizing the present invention due to the kinematically stable probe arm and controlled probe pressure and descent. In addition, a planar contact is insured by using the optical technique described herein.

The present invention offers fast, simple and inexpensive measurements. Immediate feedback is obtained using the invention. This results in the process engineer having better control of the process and improves both sort and wafer yields.

The apparatus of the present invention may also be used for doing measurements on structures with metal or polysilicon mesas.

I claim:

1. An apparatus for measurement of electrical properties of a dielectric layer in a semiconductor wafer body, said semiconductor wafer body including substrate means, said apparatus comprising:
   means for supporting said semiconductor wafer body in predetermined position;
   first electrical contact means for contacting said substrate means of said semiconductor wafer body;
   second electrical contact means for contacting said dielectric layer, said second electrical contact means comprising probe means, said probe means including conductive probe tip means, said conductive probe tip means having a uniformly flat contact portion thereon of predetermined dimensions;
   kinematically stable probe arm positioning means comprising a probe arm having said probe means affixed thereto, said kinematically stable probe arm positioning means for controlling the pressure and rate of travel of said probe tip means;
   means for establishing a planar contact between said uniformly flat contact portion of said probe tip means and the outer surface of, said dielectric layer of said semiconductor wafer body;
   measurement means for causing an electrical current to flow through said dielectric layer and measuring the resultant electrical properties of said dielectric layer, said measurement means connected in circuit with said first electrical contact means and said second electrical contact means.

2. The apparatus of claim 1, wherein said means for establishing a planar contact between said flat contact portion of said probe tip means and said dielectric layer of said semiconductor wafer body comprises an optical means for focusing on a reference plane to ensure planar contact between said flat contact portion of said probe tip means and said dielectric layer of said semiconductor wafer body.

3. The apparatus of claim 1, wherein said kinematically stable probe arm positioning means further comprising fulcrum means for supporting said probe arm.

4. The apparatus of claim 1, further comprising semiconductor wafer body horizontal and rotational movement means for moving said wafer body rotationally or horizontally relative to said probe tip means.

5. The apparatus of claim 1, wherein said conductive probe tip means is metallic.

6. The apparatus of claim 5, wherein said metallic probe tip means is tungsten-osmium alloy.

7. The apparatus of claim 1, wherein said flat contact portion of said probe tip means is circular.

8. The apparatus of claim 7, wherein said flat contact portion of said probe tip means has a diameter of from about 5 to 2000 microns.

9. A method for measurement of electrical properties of a dielectric layer in a semiconductor wafer body, aid semiconductor wafer body including substrate means, said method comprising:
   a. supporting the semiconductor wafer body in predetermined position;
   b. contacting said substrate means with a first electrical contact means;
   c. kinematically controlling a second electrical contact means to establish a uniform planar contact with the outer surface of said dielectric layer, said second electrical contact means comprising conductive probe tip means having a uniformly flat contact portion thereon of predetermined dimensions;
   d. measuring the electrical properties of said dielectric layer by causing an electrical current to flow between said first electrical contact means and said second electrical contact means.

* * * * *